(12) United States Patent
Rozbicki et al.

(10) Patent No.: US 11,270,928 B2
(45) Date of Patent: Mar. 8, 2022

(54) UNIBODY LATERAL VIA

(71) Applicant: MACOM Technology Solutions Holdings, Inc., Lowell, MA (US)

(72) Inventors: Andrzej Rozbicki, Saratoga, CA (US); Belinda Simone Edmee Piernas, Mason, NH (US); David Russell Hoag, Walpole, MA (US); James Joseph Brogle, Merrimac, MA (US); Timothy Edward Boles, Tyngsboro, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 16/838,114

(22) Filed: Apr. 2, 2020

(65) Prior Publication Data
US 2021/0313250 A1     Oct. 7, 2021

(51) Int. Cl.
*H01L 23/48*     (2006.01)
*H01L 29/861*    (2006.01)

(52) U.S. Cl.
CPC ........ *H01L 23/481* (2013.01); *H01L 29/8613* (2013.01)

(58) Field of Classification Search
CPC combination set(s) only.
See application file for complete search history.

(56) References Cited

U.S. PATENT DOCUMENTS

| | | | |
|---|---|---|---|
| 2002/0153530 A1* | 10/2002 | Levine | H01L 29/868 257/107 |
| 2003/0205715 A1 | 11/2003 | Hoag et al. | |
| 2004/0079963 A1* | 4/2004 | Taylor | H03K 17/79 257/183 |
| 2010/0032786 A1* | 2/2010 | Jung | H01L 27/1469 257/458 |
| 2010/0208517 A1* | 8/2010 | Lo | G11C 5/04 365/175 |

OTHER PUBLICATIONS

International Search Report and Written Opinion for PCT/US2021/024774 dated Jun. 16, 2021.

(Continued)

*Primary Examiner* — Moin M Rahman
(74) *Attorney, Agent, or Firm* — Thomas | Horstemeyer, LLP.; Jason M. Perilla (57) ABSTRACT

A diode semiconductor structure is described. In one example, a diode device includes a substrate, a layer of first semiconductor material of a first doping type, a layer of intrinsic semiconductor material, and a layer of second semiconductor material of a second doping type. The diode device also includes a metal contact formed on the layer of first semiconductor material and a metal via formed from a backside of the substrate, through the substrate, and through the layer of first semiconductor material, where the metal via contacts a bottom surface of the metal contact on the layer of first semiconductor material. In this configuration, a direct electrical connection can be achieved between the backside of the substrate and the metal contact on the layer of first semiconductor material without the need for an additional metal connection, such as a metal air bridge, to the metal contact.

20 Claims, 5 Drawing Sheets

(56) References Cited

OTHER PUBLICATIONS

Putnam J et al: "A 94 GHz Monolithic Switch With a Vert! Cal Pin Diode Structure", Technical Digest of the Gallium Arsenide Integrated Circuit—Symposium (GaAs IC). Philadelphia, Oct. 16, 19, 1994; [Tech ni cal Digest of the Gallium Arsenide Integrated Circuit Symposium (GaAs IC)], New York, IEEE, us, vol. SYMP. 16, Oct. 16, 1994 (Oct. 16, 1994), pp. 333-336, XP000482757,ISBN: 978-0-7803-1976-9.

Buber T et al: "Low-loss high-isolation 60-80 GHz GaAs SPST PIN switch",2003 IEEE MTT-S International Microwave Symposium Digest.(IMS 2003). Philadelphia, PA, Jun. 8-13, 2003; [IEEE MTT-S International Microwave Symposium], New York, NY: IEEE, US,Jun. 8, 2003 (Jun. 8, 2003), p. 1307; ISBN: 978-0-7803-1976-9 the whole document.

\* cited by examiner

UNIBODY LATERAL VIA

BACKGROUND

Diodes are often used as switching elements in a variety of military and commercial applications. Among others, applications include automotive collision avoidance systems (CAS), passive radiation imaging and radar systems, and switch matrix devices for computer networking applications. Many diodes used in such radio frequency (RF) and microwave applications were fabricated as homojunction devices. These devices were used in both discrete and integrated component form, for switching functions useful in high frequency operations, ranging from about one megahertz (MHz) to well above one hundred gigahertz (GHz).

SUMMARY

In one example, a diode semiconductor structure is described. The diode semiconductor structure includes a substrate, a layer of first semiconductor material of a first doping type formed on the substrate, a layer of intrinsic semiconductor material formed on the layer of first semiconductor material, and a layer of second semiconductor material of a second doping type formed on the layer of intrinsic semiconductor material. The diode semiconductor structure also includes a first metal contact formed on the layer of first semiconductor material and a second metal contact formed on the layer of second semiconductor material. The diode semiconductor structure also includes a metal via formed from a backside of the substrate, through the substrate, and through the layer of first semiconductor material. The metal via contacts a bottom surface of the first metal contact.

In other aspects, the layer of first semiconductor material can be embodied as a cathode layer of the diode semiconductor structure, and the layer of first semiconductor material is formed as a cathode mesa extending above an undercut formed in the substrate. The metal via is formed under the cathode mesa. In still other aspects, the layer of intrinsic semiconductor material and the layer of second semiconductor material are formed as an anode mesa extending above an undercut formed in the layer of first semiconductor material.

In other aspects, the first metal contact of the diode comprises a first cathode contact and a second cathode contact, and the second metal contact of the diode comprise an anode contact. The first cathode contact is formed on the cathode mesa at one side of the anode metal contact, and the second cathode contact is formed on the cathode mesa at another side of the anode metal contact. Additionally, the metal via comprises a first metal via and a second metal via. The first metal via is formed under the cathode mesa at one side of the anode metal contact, and the second metal via is formed under the cathode mesa at another side of the anode metal contact. In other examples, two or more metal vias can be formed under the cathode mesa of the diode at either or both sides of the anode metal contact of the diode.

In one example, the layer of first semiconductor material comprises a layer of gallium arsenide (GaAs) semiconductor material, and the first doping type comprises N+ doping. The layer of second semiconductor material comprises a layer of aluminum gallium arsenide (AlGaAs) semiconductor material, and the second doping type comprises P+ doping.

In other aspects, the layer of first semiconductor material comprises a cathode layer of the diode semiconductor structure, and the first metal contact comprises a cathode contact of the diode semiconductor structure. The layer of second semiconductor material comprises an anode layer of the diode semiconductor structure, and the second metal contact comprises an anode contact of the diode semiconductor structure.

In other examples, the metal via comprises one of a plurality of metal vias formed through the substrate, through the layer of first semiconductor material, and contacting the bottom surface of the first metal contact.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments.

DETAILED DESCRIPTION

The need for more highly-integrated semiconductor devices, such as transistor and diode devices, has and is expected to significantly increase with the emergence of new fields of technology. Monolithic microwave integrated circuit (MMIC) devices, for example, are now commonly deployed in radar systems and telecommunication front end modules, such as in switches, phase shifters, current and voltage control components, and limiters, among other circuit components. The emergence of metamaterial scanning arrays, for example, is reshaping the radar industry by opening new possibilities with radar systems of considerably lower cost, size, weight, and power requirements than traditional electronically-scanned arrays. The new metamaterial scanning arrays rely heavily on diodes embedded within unit cells of the array to actively tune the metamaterial between the absorber and reflector states.

In the field of diode devices, Aluminum Gallium Arsenide (AlGaAs) PIN diodes are good candidates for both mature and emerging applications. The wide bandgap of AlGaAs leads to AlGaAs PIN diodes with very low RF on-state resistance and off-state capacitance. AlGaAs PIN diode devices offer lower insertion loss at all frequencies up to 110 Ghz (and beyond) and outperform many other commercially available products. As with other semiconductor devices, it would be desirable to optimize yield and improve the reliability and performance of AlGaAs PIN diodes and the processes for manufacturing AlGaAs PIN diodes to satisfy future needs.

In one process for forming AlGaAs PIN diodes, shunt diodes are formed using one or more bridges or air bridges formed of metal, for electrical connections between the cathode of the PIN diodes and a ground pad. Metal bridges were conventionally used for such ground connections because the etching rate of the N+ Gallium Arsenide (GaAs) cathode layer varies with crystal orientation in a PIN diode, and metal bridges can be formed regardless of the orientation of the PIN diode. Thus, the use of metal bridges facilitated various circuit orientations and configurations of PIN diodes.

However, there are multiple disadvantages to the use of metal bridges. First, a minimum distance is required between lateral vias and the PIN diode to properly form the metal bridge. This minimum distance requirement, along with several other restrictions inherent to the construction of metal bridges, significantly limits the level of integration and thermal performance that can be achieved. The additional series resistance and inductance attributed to metal bridges can also degrade the quality of the ground connection and limit the high frequency response of PIN diodes. Metal bridges are also a reliability concern for high power applications, particularly because of the incidence of cracks formed in the metal bridges.

According to aspects of the embodiments described herein, a unibody lateral via configuration is introduced to eliminate the disadvantages related to the use of metal bridges. To implement a unibody via in a PIN diode, the cathode mesa of the PIN diode is extended and a via is formed directly under it. This new structural configuration is described in further detail herein.

In one example embodiment, a diode device includes a substrate, a layer of first semiconductor material of a first doping type, a layer of intrinsic semiconductor material, and a layer of second semiconductor material of a second doping type. The diode device also includes a metal contact formed on the layer of first semiconductor material and a metal via formed from a backside of the substrate, through the substrate, and through the layer of first semiconductor material, where the metal via contacts a bottom surface of the metal contact on the layer of first semiconductor material. In this configuration, a direct electrical connection can be achieved between the backside of the substrate and the metal contact on the layer of first semiconductor material without the need for an additional metal connection, such as a metal air bridge, to the metal contact.

Compared to a conventional PIN diode of similar size with metal bridges, a PIN diode with unibody lateral vias according to the embodiments exhibits a significant reduction in overall size with a center-to-center via separation across the diode decreased. In one example, the center-to-center via separation across the diode was decreased from 208 µm to 115 µm. Other advantages of PIN diodes incorporating unibody lateral vias include improved manufacturing yields by eliminating metal bridges, improved thermal behavior with metal vias closer to the anode of the PIN diode (to facilitate heat dissipation), reduced overall size leading to circuits of potentially higher density, improved high frequency performance and ground coupling, fewer limitations for high power product design with current handling capability limited only by the anode of the PIN diode, and no limitation as to the orientation of PIN diodes.

Figure 1:
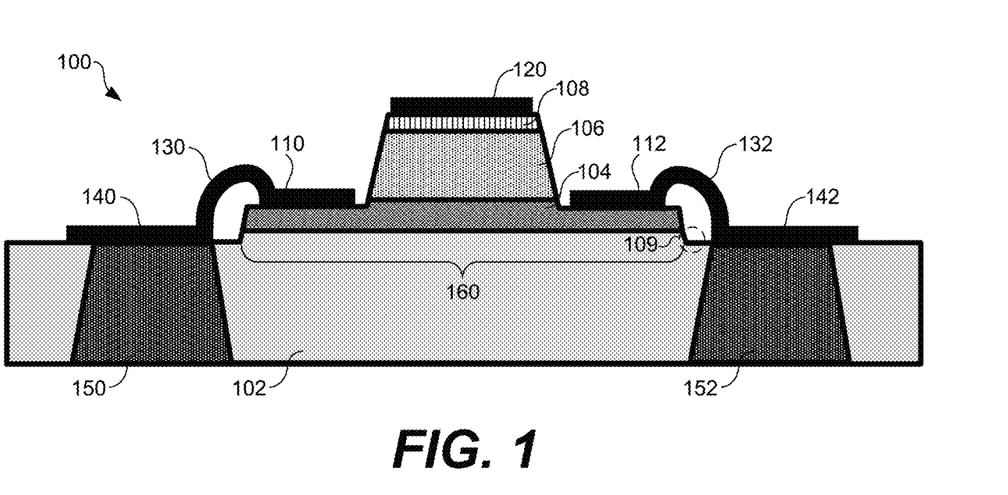
FIG. 1 illustrates a cross-sectional view of an example diode semiconductor structure.

Turning to the drawings, FIG. 1 illustrates a cross-sectional view of an example diode semiconductor structure 100 ("diode 100"). The diode 100 is illustrated as a representative example in FIG. 1. The shapes and relative sizes of the various layers of the diode 100 are not necessarily drawn to scale in FIG. 1. The layers shown in FIG. 1 are not exhaustive, and the diode 100 can include other layers and elements not separately illustrated in some cases. Additionally, diode 100 can be formed as part of a larger integrated circuit device in combination with other devices and circuit elements.

The diode 100 is a two terminal, heterojunction device suitable for use as a switch. The diode 100 includes a substrate 102, a layer 104 of first semiconductor material ("first layer 104") of a first doping type formed on the substrate 102, a layer 106 of intrinsic semiconductor material ("intrinsic layer 106") formed on the first layer 104, and a layer 108 of second semiconductor material ("second layer 108") of a second doping type formed on the intrinsic layer 106. Although a particular example is illustrated in FIG. 1 and described below, the diode 100 can be embodied in various ways, including as any of the diode devices shown and described in U.S. Pat. No. 6,794,734, the entire contents of which is hereby incorporated herein by reference.

In one example, the substrate 102 can be embodied as a GaAs semiconductor substrate of suitable thickness. The first layer 104 is a cathode layer of the diode 100. The first layer 104 can be embodied as a layer of GaAs semiconductor material, and the first doping type can be N+ doping (for a layer of N+ GaAs semiconductor material), by a suitable concentration of Silicon (Si), although other types of semiconductor materials and doping types can be relied upon. The first layer 104 can be formed directly on the substrate 102 at a suitable thickness by epitaxial deposition. As shown in FIG. 1, the first layer 104 is formed as a cathode mesa 160 extending above an undercut 109 formed in the substrate 102, by etching.

The intrinsic layer 106 can be embodied as a layer of intrinsic (e.g., undoped or not intentionally doped) GaAs semiconductor material. The intrinsic layer 106 can be formed directly on the first layer 104 at a suitable thickness by epitaxial deposition. The intrinsic layer 106, in part, establishes the breakdown voltage and the capacitance of the diode 100.

The second layer 108 is an anode layer of the diode 100. The second layer 108 can be embodied as a layer of AlGaAs semiconductor material, and the second doping type can include P+ doping (for a layer of P+ AlGaAs semiconductor material), by a suitable concentration of Carbon (C), although other types of semiconductor materials and doping types can be relied upon. The second layer 108 can be formed directly on the intrinsic layer 106. As shown in FIG. 1, the intrinsic layer 106 and the second layer 108 are formed as a mesa extending above an undercut formed in the first layer 104, by etching.

The diode 100 also includes metal contacts 110, 112, and 120. The metal contacts 110 and 112 are formed on the first layer 104, and the metal contact 120 is formed on the second layer 108. The metal contacts 110 and 112 are disposed on a top surface of the first layer 104 to provide ohmic contacts to the cathode of the diode 100. The metal contact 120 is disposed on a top surface of the second layer 108 to provide an ohmic contact to the anode of the diode 100. Metal pads 140 and 142 are also formed on the top surface of the substrate 102 for electrical connections to the cathode of the diode 100. Particularly, metal bridges 130 and 132 are formed to electrically connect the metal pads 140 and 142 to the metal contacts 110 and 112, respectively, as described in further detail below.

In the diode 100, the P+ AlGaAs semiconductor material of the second layer 108 has a wider band gap than the intrinsic GaAs semiconductor material of the intrinsic layer 106. This difference in energy between the conduction and valence bands in the semiconductor materials of the second layer 108 and the intrinsic layer 106 results in the creation of a suitable barrier height difference, which both enhances forward injection of holes from the anode region into the intrinsic region and retards the back injection of electrons from the intrinsic region into the anode region. Injected carriers of the junction are confined due to the band gap difference, effectively reducing the series resistance within the intrinsic region of the diode 100. The increased carrier concentration in the intrinsic region reduces the resistance in the intrinsic region, which also leads to reduction of insertion loss without a compromise in isolation.

The diode 100 is operable as a high frequency switch. The resistance of the intrinsic region can be varied by many orders of magnitude as a function of the application of a direct current (DC) bias to the diode 100. When the diode 100 is in the "off" state (e.g., without forward DC bias), the diode 100 operates as an electrical open, such that coupling occurs only through capacitance. Accordingly, by making the off-state capacitance of the diode 100 small, coupling is minimal, and impedance is high at high frequencies without a forward DC bias. At the same time, by making the on-state resistance of the diode 100 small, the series resistance of the diode 100 is also low when a forward DC bias is applied.

A number of diodes similar to the diode 100 can be formed on the substrate 102, and the diodes can be electrically connected to each other and to other passive components, such as resistors, capacitors, and inductors, in various ways, to form larger circuits. The electrical connections for series- and shunt-connected diodes can impact the process steps and structures used for interconnections between the diodes. For example, for the fabrication of series-connected diodes, the substrate 102 can be about 8 mils in thickness. For the fabrication of shunt-connected diodes, the substrate 102 can be reduced down to 4 mils in thickness, although other suitable thicknesses can be relied upon, and via holes can be etched through from the backside of the substrate 102.

As shown in FIG. 1, via holes are etched and metal vias 150 and 152 are formed through from the backside of the substrate 102. The metal vias 150 and 152 extend through the substrate 102 and electrically connect, respectively, with the metal pads 140 and 142, which are formed on the top surface of the substrate 102. Additionally, metal bridges 130 and 132 are formed to electrically connect the metal pads 140 and 142 to the metal contacts 110 and 112, respectively, as shown in FIG. 1. In this way, the cathode metal contacts 110 and 112 of the diode 100 can be connected to ground by way of electrical connections under the substrate 102, particularly for shunt-connected diodes.

There are a number of disadvantages to the use of the metal bridges 130 and 132 for electrical connections to the diode 100. First, a minimum distance is required between the metal vias 150 and 152 and the diode 100 to properly form the metal bridges 130 and 132. This minimum distance requirement, along with several other restrictions inherent to the construction of the metal bridges 130 and 132 limits the level of integration and thermal performance that can be achieved for the diode 100, among other diodes formed on the substrate 102. The additional series resistance and inductance attributed to the metal bridges 130 and 132 can also degrade the quality of the ground connections for shunt-connected diodes and limit the high frequency response of diode 100. The metal bridges 130 and 132 are also a reliability concern because of the incidence of cracks formed in the metal bridges 130 and 132, particularly where contacting the metal pads 140 and 142.

Figure 2:
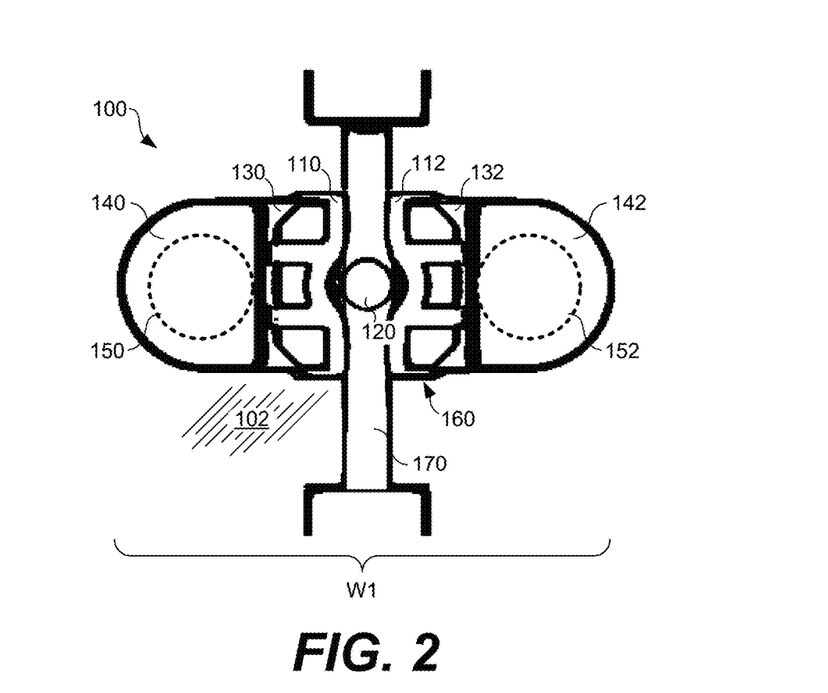
FIG. 2 illustrates a top-down view of the example diode semiconductor structure shown in FIG. 1.

FIG. 2 illustrates a top-down view of the diode 100 shown in FIG. 1. In FIG. 2, the metal contacts 110 and 112, which are formed on the first layer 104, are shown, extending toward the edge of the cathode mesa 160. The metal pads 140 and 142 are also shown on the top surface of the substrate 102, with the positions of the metal vias 150 and 152 shown below the metal pads 140 and 142 using hidden lines. The diode 100, including the metal pads 140 and 142, can be measured as "W1" in size along one dimension.

A metal trace 170 is relied upon as an electrical contact with the anode metal contact 120 of the diode 100. The metal bridges 130 and 132 are also shown in FIG. 2, electrically connecting the metal pads 140 and 142 to the metal contacts 110 and 112 of the cathode of the diode 100, respectively. The metal bridges 130 and 132 are shown to include a number of fingers extending from the metal pads 140 and 142 to the metal contacts 110 and 112. In some cases, when the metal bridges 130 and 132 are formed, the metal bridges 130 and 132 fail to adhere or make contact with the metal contacts 110 and 112 on the first layer 104. Also, cracks can occur in the metal bridges 130 and 132, particularly where the metal bridges 130 and 132 meet the metal pads 140 and 142.

Semiconductor devices, including but not limited to diode devices, incorporating one or more unibody lateral vias are described herein to offer a number of improvements. PIN diodes incorporating one or more unibody lateral vias, for example, can be relied upon to overcome the drawbacks of using metal bridges, improve device performance, reduce costs, increase reliability, and achieve other benefits.

Figure 3:
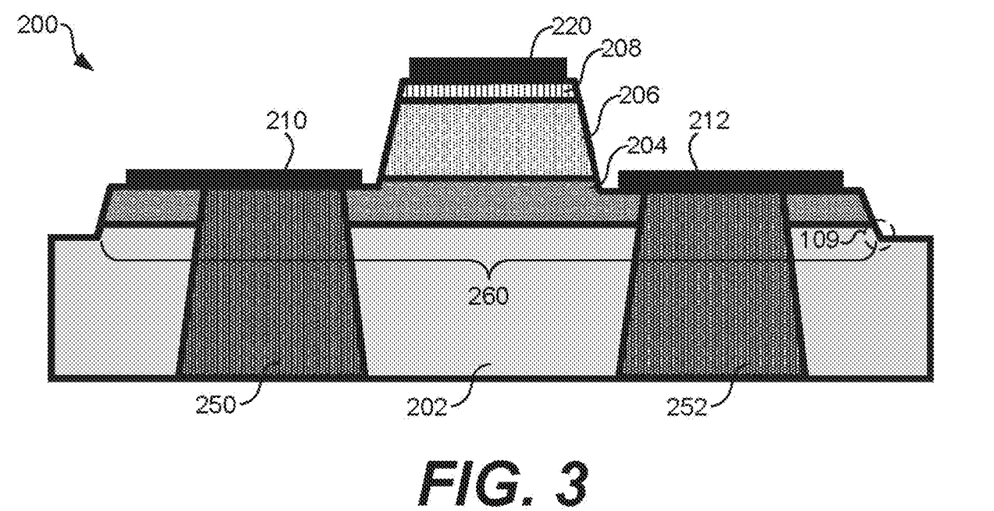
FIG. 3 illustrates a cross-sectional view of an example diode semiconductor structure according to various aspects of the embodiments.

FIG. 3 illustrates a cross-sectional view of an example diode semiconductor structure 200 ("diode 200") according to various aspects of the embodiments. The diode 200 is illustrated as a representative example in FIG. 3 (and FIG. 4). The shapes and relative sizes of the various layers of the diode 200 are not necessarily drawn to scale in FIG. 3. The layers shown in FIG. 3 are not exhaustive, and the diode 200 can include other layers and elements not separately illustrated in some cases. Additionally, diode 200 can be formed as part of a larger integrated circuit device in combination with other devices and circuit elements.

Similar to the diode 100, the diode 200 is a two terminal, heterojunction device suitable for use as a switch. The diode 200 includes a substrate 202, a layer 204 of first semiconductor material ("first layer 204") of a first doping type formed on the substrate 202, a layer 206 of intrinsic semiconductor material ("intrinsic layer 206") formed on the first layer 204, and a layer 208 of second semiconductor material ("second layer 208") of a second doping type formed on the intrinsic layer 206. One example of the diode 200 is illustrated in FIG. 3 and described below. In a more particular case, the diode 200 can be embodied, in part, as a number of semiconductor material layers, similar but not limited to those described in U.S. Pat. No. 6,794,734.

In one example, the substrate 202 can be embodied as a GaAs semiconductor substrate of suitable thickness, although other types of semiconductor substrates can be relied upon. The first layer 204 is a cathode layer of the diode 200. The first layer 204 can be embodied as a layer of GaAs semiconductor material, and the first doping type can be N+ doping (for a layer of N+ GaAs semiconductor material), by a suitable concentration of Silicon (Si), although other types of semiconductor materials and doping types can be relied upon. The first layer 204 can be formed directly on the substrate 202 at a suitable thickness by epitaxial deposition or another suitable technique. As shown in FIG. 3, the first layer 204 is formed as a cathode mesa 260 extending above an undercut 209 formed in the substrate 202, by etching.

The intrinsic layer 206 can be embodied as a layer of intrinsic (e.g., undoped or not intentionally doped) GaAs semiconductor material, for example, among other semiconductor materials. The intrinsic layer 206 can be formed directly on the first layer 204 at a suitable thickness by epitaxial deposition or another suitable technique. The intrinsic layer 206, in part, establishes the breakdown voltage and the capacitance of the diode 200.

The second layer 208 is an anode layer of the diode 200. The second layer 208 can be embodied as a layer of AlGaAs semiconductor material, for example, and the second doping type can include P+ doping (for a layer of P+ AlGaAs semiconductor material), by a suitable concentration of Carbon (C), although other types of semiconductor materials and doping types can be relied upon. The second layer 208 can be formed directly on the intrinsic layer 206 by epitaxial deposition or another suitable technique. As shown in FIG. 3, the intrinsic layer 206 and the second layer 208 are formed as a mesa extending above an undercut formed in the first layer 204, by etching.

The diode 200 also includes metal contacts 210, 212, and 220. The metal contacts 210 and 212 are formed on the first layer 204, and the metal contact 220 is formed on the second layer 208. The metal contacts 210 and 212 are disposed on a top surface of the first layer 204 to provide ohmic contacts to the cathode of the diode 200. The metal contact 220 is disposed on a top surface of the second layer 208 to provide an ohmic contact to the anode of the diode 200. However, the diode 200 does not rely upon the metal pads 140 and 142, as shown in FIG. 1, for electrical connections to the cathode of the diode 200. Similarly, the diode 200 does not rely upon the metal bridges 130 and 132, as shown in FIG. 1.

Similar to the diode 100, the diode 200 is operable as a high frequency switch. The resistance of the intrinsic region can be varied by many orders of magnitude as a function of the application of a DC bias to the diode 200. When the diode 200 is in the "off" state (e.g., without forward DC bias), the diode 200 operates as an electrical open, such that coupling occurs only through capacitance. Accordingly, by making the off-state capacitance of the diode 200 small, coupling is minimal, and impedance is high at high frequencies without a forward DC bias. At the same time, by making the on-state resistance of the diode 200 small, the series resistance of the diode 200 is also low when a forward DC bias is applied.

A number of diodes similar to the diode 200 can be formed on the substrate 202, and the diodes can be electrically connected to each other and to other passive components, such as resistors, capacitors, and inductors, in various ways, to form larger circuits. The electrical connections for series- and shunt-connected diodes can impact the process steps and structures used for interconnections between the diodes. For example, for the fabrication of series-connected diodes, the substrate 202 can be 8 mils in thickness. For the fabrication of shunt-connected diodes, the substrate 202 can be reduced down to 4 mils in thickness, and via holes can be etched through from the backside of the substrate 202.

As shown in FIG. 3, via holes are etched and metal vias 250 and 252 are formed through from the backside of the substrate 202. The metal vias 250 and 252 extend through the substrate 202 and electrically connect, respectively, with the metal contacts 210 and 212, at a bottom surface of the metal contacts 210 and 212. Particularly, the metal via 250 is formed from the backside of the substrate 202, through the substrate 202, and through the first layer 204. The metal via 250 contacts a bottom surface of the metal contact 210. Additionally, the metal via 252 is formed from the backside of the substrate 202, through the substrate 202, and through the first layer 204. The metal via 250 contacts a bottom surface of the metal contact 210. In this way, the metal contacts 210 and 212 of the cathode of the diode 200 can be connected to ground by way of electrical connections under the substrate 102, particularly for shunt-connected diodes.

As compared to the diode 100, the diode 200 is designed to avoid the need for metal bridges. The cathode mesa 260 of the diode 200 is formed to be larger than the cathode mesa 160 of the diode 100, although the overall size of the diode 200 is smaller than the diode 200. The metal contacts 210 and 212 of the diode 200 can also be formed to be larger than the metal contacts 110 and 112 of the diode 100 in some cases. The particular size and shape of the cathode mesa 260 can vary among the embodiments, but the cathode mesa 260 is generally formed to be large enough to accommodate one or more metal vias formed from beneath the substrate 202. The sizes and shapes of the metal contacts 210 and 212 can also vary but are formed to permit contact with one or more metal vias formed from beneath the substrate 202.

Figure 4:
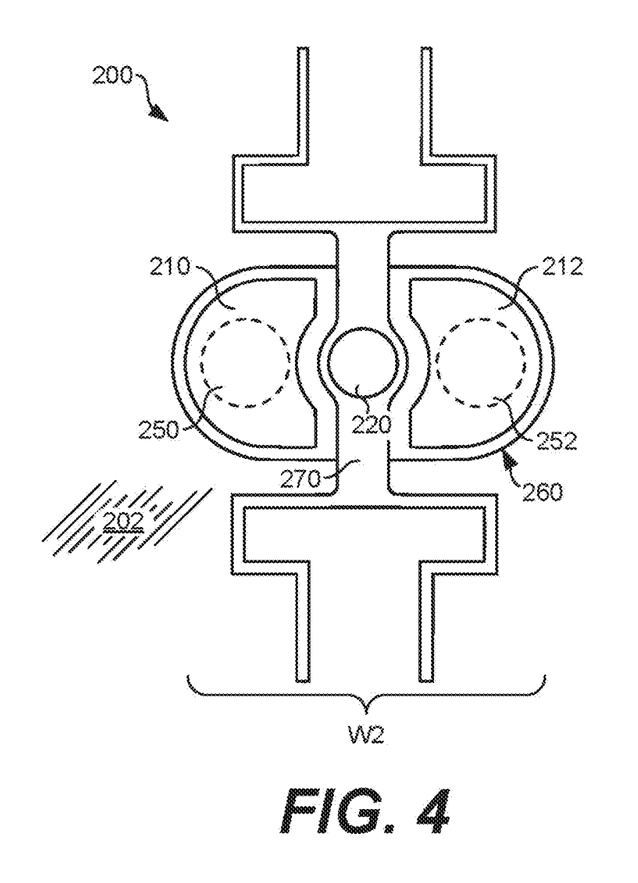
FIG. 4 illustrates a top-down view of the example diode semiconductor structure shown in FIG. 3 according to various aspects of the embodiments.

FIG. 4 illustrates a top-down view of the diode 200 shown in FIG. 3. The metal contacts 210 and 212, which are formed on the first layer 204, are shown in FIG. 4 extending toward the edge of the cathode mesa 260. The positions of the metal vias 250 and 252 are shown below the metal contacts 210 and 212 using hidden lines. A metal trace 270 is relied upon as an electrical contact with the anode metal contact 220 of the diode 200. The diode 200, including the metal contacts 210 and 212, can be measured as "W2" in size along one dimension. As compared to the diode 100 shown in FIG. 2, "W2" is smaller than "W1," and the diode 200 shown in FIG. 4 is significantly smaller. In one example, the center-to-center via separation between the vias 150 and 152 across the diode 100 was decreased from 208 µm to 115 µm for the via separation between the vias 250 and 252 across the diode 200.

Figure 5:
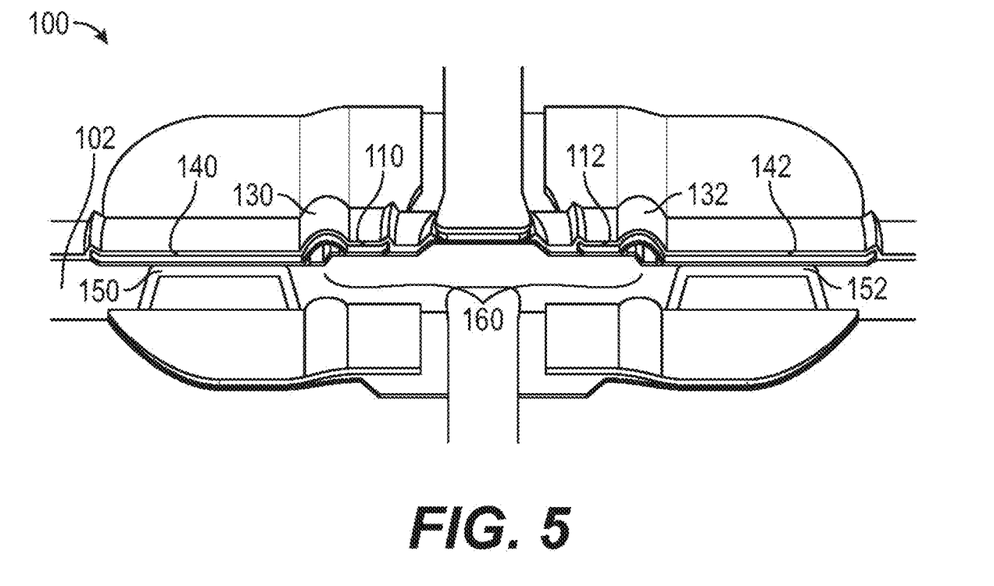
FIG. 5 is a photograph including a cross-sectional view of the example diode semiconductor structure shown in FIG. 1.
Figure 6:
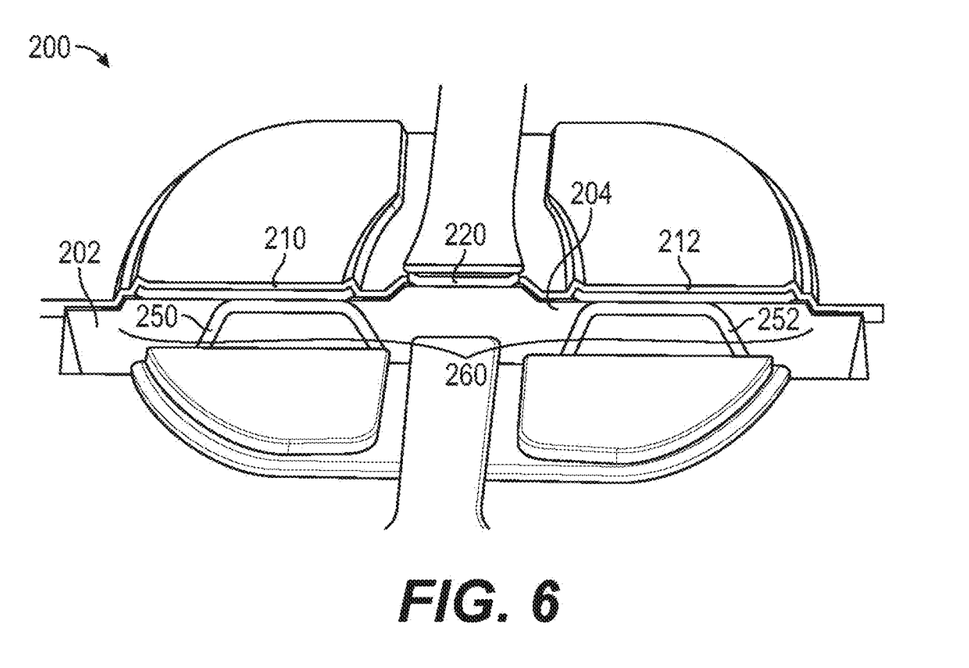
FIG. 6 is a photograph including a cross-sectional view of the example diode semiconductor structure shown in FIG. 3 according to various aspects of the embodiments.

The metal vias 250 and 252 are unibody with the diode 200, formed under the cathode mesa layer 204 of the diode 200. The metal vias 250 and 252 extend through the substrate 202 and electrically connect, respectively, with the metal contacts 210 and 212, at a bottom surface of the metal contacts 210 and 212. Particularly, the metal via 250 contacts a bottom surface of the metal contact 210, and the metal via 250 contacts a bottom surface of the metal contact 210. In the structural configuration of the diode 200 as shown in FIGS. 5 and 6, it is not necessary to rely upon metal bridges for electrical connections between the metal vias 250 and 252 and the metal contacts 210 and 212. As such, the failure modes inherent to metal bridges are not attributed to the diode 200.

Overall, among other advantages, the diode 200 exhibits a significant reduction in overall size with a decreased center-to-center via separation for higher density MMICs. The diode 200 can be manufactured at improved yields by eliminating metal bridges. The diode 200 exhibits improved thermal behavior with metal vias closer to the anode. The diode 200 exhibits improved high frequency performance and ground coupling, with fewer limitations for high power product design based on higher current handling capability. The diode 200 can also be manufactured without any limitations as to orientation on the substrate.

FIG. 5 is a photograph including a cross-sectional view of the example diode 100 shown in FIG. 1. As shown, via holes are etched and metal vias 150 and 152 are formed through from the backside of the substrate 102. The metal vias 150 and 152 extend through the substrate 102 and electrically connect, respectively, with the metal pads 140 and 142, which are formed on the top surface of the substrate 102. Additionally, metal bridges 130 and 132 are formed to electrically connect the metal pads 140 and 142 to the metal contacts 110 and 112, respectively. In this way, the cathode metal contacts 110 and 112 of the diode 100 can be connected to ground by way of electrical connections under the substrate 102, particularly for shunt-connected diodes. Both the metal vias 150 and 152 are formed outside of (i.e., not underneath) the first layer 104 in the diode 100, at a distance from the anode of the diode 100.

FIG. 6 is a photograph including a cross-sectional view of the diode 200 shown in FIG. 3 according to various aspects of the embodiments. As shown, via holes are etched and metal vias 250 and 252 are formed through from the backside of the substrate 202. The metal vias 250 and 252 extend through the substrate 202 and electrically connect, respectively, with the metal contacts 210 and 212, at a bottom surface of the metal contacts 210 and 212. Particularly, the metal via 250 is formed from the backside of the substrate 202, through the substrate 202, and through the first layer 204. The metal via 250 contacts a bottom surface of the metal contact 210. Additionally, the metal via 252 is formed from the backside of the substrate 202, through the substrate 202, and through the first layer 204. The metal via 250 contacts a bottom surface of the metal contact 210. Both the metal vias 250 and 252 are formed under the first layer 204 and in closer proximity to the anode of the diode 200, and the metal vias 250 and 252 are referenced herein as unibody lateral vias for that structural configuration. The metal vias 250 and 252 are more capable of conducting heat away from the anode of the diode 200 as compared to the diode 100.

Figure 7A:
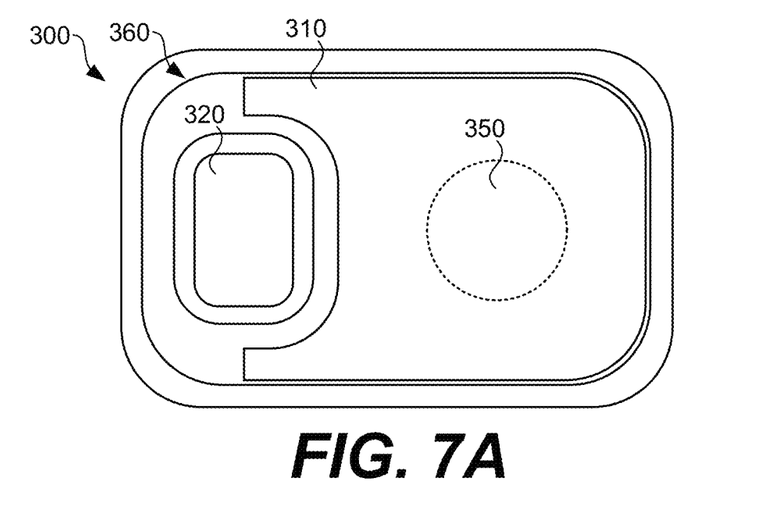
FIGS. 7A-7C illustrate top-down views of diode semiconductor structures including alternative arrangements of unibody vias according to various aspects of the embodiments.
Figure 7B:
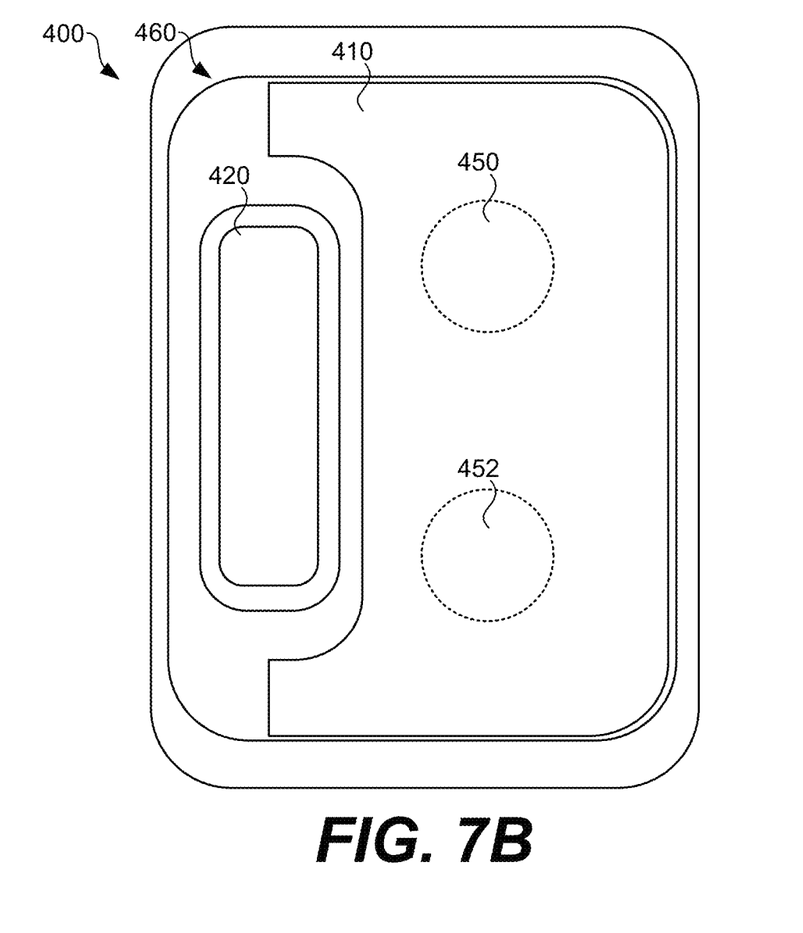
Figure 7C:
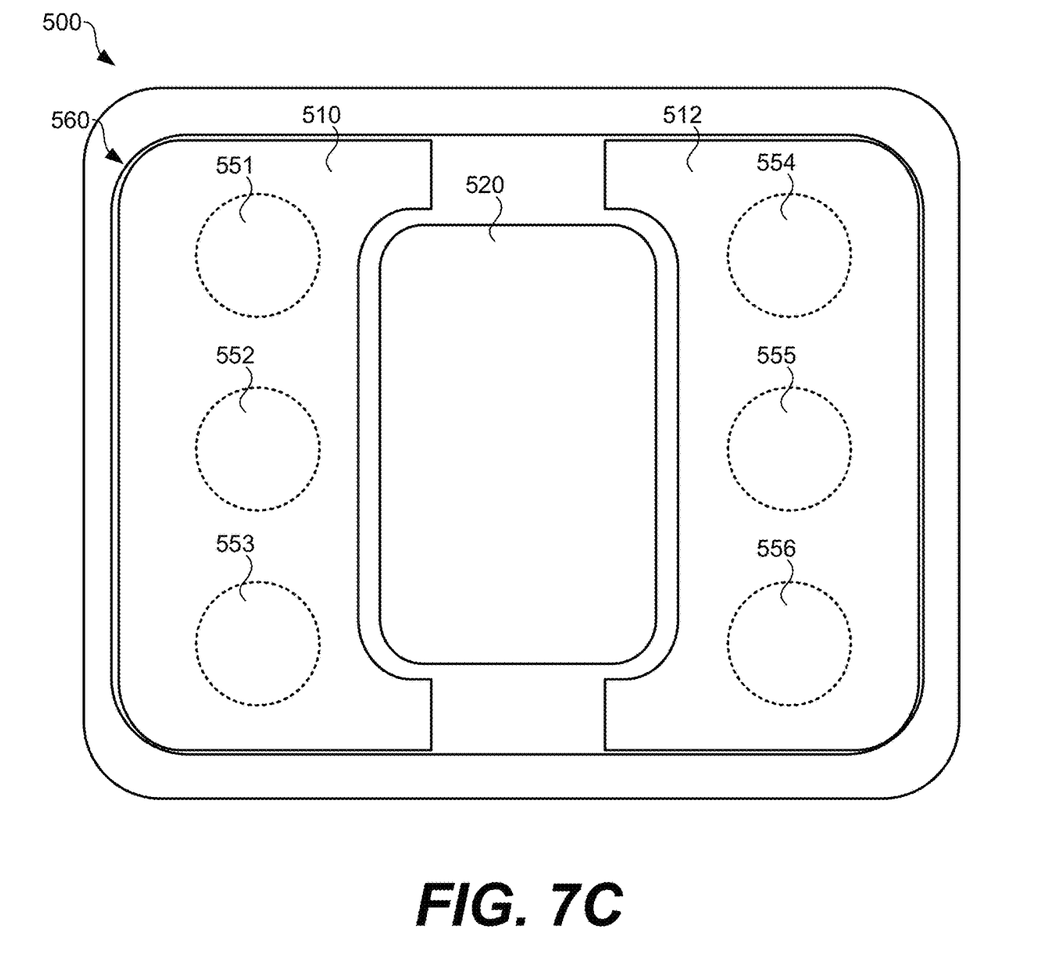

While the diode 200 includes a first metal via 250 on one side of the anode metal contact 220 and a second metal via 252 on the other side of the anode metal contact 220, other arrangements of unibody vias are within the scope of the embodiments. In that context, FIGS. 7A-7C illustrate top-down views of diode semiconductor structures including alternative arrangements of unibody vias according to various aspects of the embodiments. FIGS. 7A-7B present examples of different shapes and configurations of diodes including unibody lateral vias, but the examples are not intended to be limiting, as other shapes, styles, and configurations are within the scope of the embodiments.

In FIG. 7A, a diode 300 includes a cathode metal contact 310, an anode metal contact 320, and a cathode mesa 360 is shown. Additionally, the position of one unibody metal via 350 is shown below the cathode metal contact 310 using hidden lines. The top of the metal via 350 contacts the bottom surface of the cathode metal contact 310, consistent with the embodiments described herein. In the example shown, the anode and cathode layers of the diode 300 are formed to be rectangular, with curved corners, rather than round. Also, the diode 300 includes only one cathode metal contact 310 and only one metal via 350 on one side of the anode metal contact 320.

In FIG. 7B, a diode 400 including a cathode metal contact 410, an anode metal contact 420, and a cathode mesa 460 is shown. Additionally, the position of two unibody metal vias 450 and 452 are shown below the cathode metal contact 410 using hidden lines. The metal vias 350 and 352 contact the bottom surface of the cathode metal contact 410, consistent with the embodiments described herein. In the example shown, the anode and cathode layers of the diode 400 are formed to be rectangular, with curved corners, rather than round. Also, the diode 100 includes one cathode metal contact 310 but two metal vias 450 and 452 on one side of the anode metal contact 420.

In FIG. 7C, a diode 500 including cathode metal contacts 510 and 512, an anode metal contact 520, and a cathode mesa 560 is shown. Additionally, the position of three unibody metal vias 551-553 are shown below the cathode metal contact 510 using hidden lines, and the position of three unibody metal vias 554-556 are shown below the cathode metal contact 512 using hidden lines. The metal vias 551-553 contact the bottom surface of the cathode metal contact 510, and the metal vias 554-556 contact the bottom surface of the cathode metal contact 512. In the example shown, the anode and cathode layers of the diode 500 are formed to be rectangular, with curved corners, rather than round. The diode 500 includes two cathode metal contacts 510 and 512 on opposite sides of the anode metal contact 520, and three metal vias 551-553 and 554-556, respectively, on opposite sides of the anode metal contact 520.

The PIN diode structures and devices described herein can be used to fabricate a wide variety of useful integrated circuits, including limiters, switches, and other circuits. The PIN diode structures can also be integrated with various components in a monolithic circuit format suitable for microwave circuit applications. Although embodiments have been described herein in detail, the descriptions are by way of example. The concepts described herein are also not limited to improvements in PIN diodes. The concepts can be applied to other types of semiconductor devices, such as various types of diodes, transistors, controlled rectifiers, thyristors, semiconductor lasers, photo cells, and other devices.

The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. A diode semiconductor structure, comprising:
    a substrate;
    a layer of first semiconductor material of a first doping type formed on the substrate;
    a layer of intrinsic semiconductor material formed on the layer of first semiconductor material;
    a layer of second semiconductor material of a second doping type formed on the layer of intrinsic semiconductor material;
    a first metal contact formed on the layer of first semiconductor material;
    a second metal contact formed on the layer of second semiconductor material; and
    a metal via formed from a backside of the substrate, through the substrate, and through the layer of first semiconductor material, wherein the metal via contacts a bottom surface of the first metal contact.

2. The diode semiconductor structure according to claim 1, wherein
    the layer of first semiconductor material comprises a cathode layer of the diode semiconductor structure; and the layer of first semiconductor material is formed as a cathode mesa extending above an undercut formed in the substrate.

3. The diode semiconductor structure according to claim 2, wherein the metal via is formed under the cathode mesa.

4. The diode semiconductor structure according to claim 3, wherein:
the first metal contact comprises a first cathode contact and a second cathode contact;
the first cathode contact is formed on the cathode mesa at one side of the second metal contact;
the second cathode contact is formed on the cathode mesa at another side of the second metal contact;
the metal via comprises a first metal via and a second metal via;
the first metal via is formed under the cathode mesa at one side of the second metal contact; and
the second metal via is formed under the cathode mesa at another side of the second metal contact.

5. The diode semiconductor structure according to claim 1, wherein:
the layer of second semiconductor material comprises an anode layer of the diode semiconductor structure; and
the layer of intrinsic semiconductor material and the layer of second semiconductor material are formed as an anode mesa extending above an undercut formed in the layer of first semiconductor material.

6. The diode semiconductor structure according to claim 1, wherein:
the layer of first semiconductor material comprises a layer of gallium arsenide (GaAs) semiconductor material; and
the first doping type comprises N+ doping.

7. The diode semiconductor structure according to claim 1, wherein:
the layer of first semiconductor material comprises a cathode layer of the diode semiconductor structure; and
the first metal contact comprises a cathode contact of the diode semiconductor structure.

8. The diode semiconductor structure according to claim 1, wherein:
the layer of second semiconductor material comprises a layer of aluminum gallium arsenide (AlGaAs) semiconductor material; and
the second doping type comprises P+ doping.

9. The diode semiconductor structure according to claim 1, wherein:
the layer of second semiconductor material comprises an anode layer of the diode semiconductor structure; and
the second metal contact comprises an anode contact of the diode semiconductor structure.

10. The diode semiconductor structure according to claim 1, wherein the metal via comprises one of a plurality of metal vias formed through the substrate, through the layer of first semiconductor material, and contacting the bottom surface of the first metal contact.

11. A semiconductor structure, comprising:
a substrate;
a layer of first semiconductor material formed as a first mesa on the substrate;
a layer of intrinsic semiconductor material formed on the layer of first semiconductor material;
a layer of second semiconductor material formed on the layer of intrinsic semiconductor material, the layer of intrinsic semiconductor material and the layer of second semiconductor material being formed as a second mesa on the layer of first semiconductor material;
a first metal contact formed on the layer of first semiconductor material; and
a metal via formed through the substrate, through the layer of first semiconductor material, and contacting a bottom surface of the first metal contact.

12. The semiconductor structure according to claim 11, wherein
the layer of first semiconductor material comprises a cathode layer; and
the layer of first semiconductor material is formed as a cathode mesa extending above an undercut formed in the substrate.

13. The semiconductor structure according to claim 12, wherein the metal via is formed under the cathode mesa.

14. The semiconductor structure according to claim 13, wherein:
the first metal contact comprises a first cathode contact and a second cathode contact;
the first cathode contact is formed on the cathode mesa at one side of an anode metal contact of the semiconductor structure;
the second cathode contact is formed on the cathode mesa at another side of the anode metal contact;
the metal via comprises a first metal via and a second metal via;
the first metal via is formed under the cathode mesa at one side of the anode metal contact; and
the second metal via is formed under the cathode mesa at another side of the anode metal contact.

15. The semiconductor structure according to claim 11, wherein the layer of first semiconductor material comprises a layer of gallium arsenide (GaAs) semiconductor material of N+ doping.

16. The semiconductor structure according to claim 11, wherein:
the layer of first semiconductor material comprises a cathode layer of the semiconductor structure; and
the first metal contact comprises a cathode contact of the semiconductor structure.

17. The semiconductor structure according to claim 11, wherein the layer of second semiconductor material comprises a layer of aluminum gallium arsenide (AlGaAs) semiconductor material of P+ doping.

18. The semiconductor structure according to claim 11, wherein:
the layer of second semiconductor material comprises an anode layer of the semiconductor structure; and
the semiconductor structure further comprises an anode metal contact formed on the anode layer.

19. A PIN diode, comprising:
a substrate;
a cathode layer over the substrate;
an intrinsic layer over the cathode layer;
an anode layer over the intrinsic layer;
a cathode metal contact on the cathode layer; and
a metal via that extends from a backside of the substrate, through the substrate, through the cathode layer, and contacts a bottom surface of the cathode metal contact.

20. The PIN diode according to claim 19, wherein the metal via comprises one of a plurality of metal vias that extend from a backside of the substrate, through the substrate, through the cathode layer, and contact the bottom surface of the cathode metal contact.

* * * * *